(12) United States Patent
Réblewski (10) Patent No.: US 7,478,261 B2
(45) Date of Patent: Jan. 13, 2009

(54) RECONFIGURABLE CIRCUIT WITH REDUNDANT RECONFIGURABLE CLUSTER(S)

(75) Inventor: Frédéric Réblewski, Paris (FR)

(73) Assignee: M2000, Bievres (FR)

( * ) Notice: Subject to any disclaimer, the term of this patent is extended or adjusted under 35 U.S.C. 154(b) by 504 days.

(21) Appl. No.: 11/225,750

(22) Filed: Sep. 13, 2005

(65) Prior Publication Data

US 2007/0057693 A1    Mar. 15, 2007

(51) Int. Cl.
G06F 11/00    (2006.01)
(52) U.S. Cl. .......................................... 714/3; 714/733
(58) Field of Classification Search ................... 714/3, 714/733, 734; 326/10
See application file for complete search history.

(56) References Cited

U.S. PATENT DOCUMENTS

| | | | |
|---|---|---|---|
| 4,020,469 A | 4/1977 | Manning | |
| 4,642,487 A | 2/1987 | Carter | |
| 4,700,187 A | 10/1987 | Furtek | |
| 4,870,302 A | 9/1989 | Freeman | |
| 4,918,440 A | 4/1990 | Furtek | |
| 5,208,491 A | 5/1993 | Ebeling et al. | |
| RE34,363 E | 8/1993 | Freeman | |
| 5,255,203 A | 10/1993 | Agrawal et al. | |
| 5,260,610 A | 11/1993 | Pedersen et al. | |
| 5,396,126 A | 3/1995 | Britton et al. | |
| 5,430,734 A | 7/1995 | Gilson | |
| 5,455,525 A | 10/1995 | Ho et al. | |
| 5,457,410 A | 10/1995 | Ting | |
| 5,498,975 A | 3/1996 | Cliff et al. | |
| 5,519,629 A | 5/1996 | Snider | |
| 5,574,388 A | 11/1996 | Barbier et al. | |
| 5,594,363 A | 1/1997 | Freeman et al. | |
| 5,640,327 A | 6/1997 | Ting | |
| 5,648,911 A | 7/1997 | Grodstein et al. | |
| 5,742,181 A | 4/1998 | Rush | |
| 5,777,887 A * | 7/1998 | Marple et al. ................. 716/4 |
| 5,796,268 A | 8/1998 | Kaplinsky | |
| 5,825,203 A | 10/1998 | Kusunoki et al. | |
| 5,939,930 A | 8/1999 | Young | |
| 5,991,517 A * | 11/1999 | Harari et al. .................. 714/3 |
| 6,034,536 A | 3/2000 | McClintock et al. | |
| 6,088,526 A | 7/2000 | Ting et al. | |
| 6,137,308 A | 10/2000 | Nayak | |
| 6,148,390 A | 11/2000 | MacArthur et al. | |
| 6,166,559 A | 12/2000 | McClintock et al. | |
| 6,201,404 B1 | 3/2001 | Reddy et al. | |

(Continued)

FOREIGN PATENT DOCUMENTS

FR    2 660 510 A1    10/1991

OTHER PUBLICATIONS

Demjanenko, M. et al., Dynamic Techniques For Yield Enhancement of Field Programmable Logic Arrays, New Frontiers in Testing, Proceedings of the International Test Conference, Washington, IEEE Comp. Soc. Press, US, Vo. Conf. 19, Sep. 12, 1988.

(Continued)

*Primary Examiner*—Marc Duncan
(74) *Attorney, Agent, or Firm*—Schwabe, Williamson & Wyatt P.C.

(57) ABSTRACT

A reconfigurable circuit having redundant reconfigurable clusters is described herein.

24 Claims, 4 Drawing Sheets

U.S. PATENT DOCUMENTS

| | | | |
|---|---|---|---|
| 6,204,688 | B1 | 3/2001 | Cliff et al. |
| 6,215,326 | B1 | 4/2001 | Jefferson et al. |
| 6,218,859 | B1 | 4/2001 | Pedersen et al. |
| 6,259,272 | B1 | 7/2001 | Cliff et al. |
| 6,289,494 | B1 | 9/2001 | Sample |
| 6,294,928 | B1 | 9/2001 | Lytle et al. |
| 6,344,755 | B1 * | 2/2002 | Reddy et al. .................. 326/10 |
| 6,347,378 | B1 * | 2/2002 | MacArthur et al. ......... 713/310 |
| 6,976,198 | B1 * | 12/2005 | Vaida ........................ 714/725 |
| 7,205,785 | B1 * | 4/2007 | Carlson ........................ 326/8 |
| 7,251,804 | B1 * | 7/2007 | Trimberger .................. 716/16 |
| 7,277,346 | B1 * | 10/2007 | Rahim et al. ............. 365/225.7 |
| 2002/0031025 | A1 | 3/2002 | Shimano et al. |
| 2002/0113619 | A1 | 8/2002 | Wong |

OTHER PUBLICATIONS

Wey C-L et al., Design of Repairable and Fully Testable Folded PLAs, Conference on Computer Design: VLSI in Computers and Processors, IEEE Comp. Soc. Press, US, Sep. 17, 1990.

Xilinx, Inc. "Virtex 2.5 V Filed Programmable Gate Arrays, Product Specification DSO03-2 (v2.6)" Jul. 19, 2001.

Xilinx, Inc. "XC4000E and XC4000X Series Field Programmable Gate Arrays, Product Specification (v1.6)" May 14, 1999.

Xilinx, Inc. "XC3000 Series Field Programmable Gate Arrays (XC2000A/L, XC300A/L)" (v3.1); Nov. 9, 1998.

Amerson, R., et al. "Plasma: An FPGA for Million Gates Systems" FPGA 1996.

Hill, Dwight D., D.R. Cassiday "Preliminary Description of Tabula Rasa, an Electrically Reconfigurable Hardware Engine" IEEE International Conference on Computer Design: VLSI in Computers & Processors (Sep. 1990); pp. 391-395.

Rose, J., et al. "Architecture of Field-Programmable Gate Arrays: The Effect of Logic Block Functionality on Area Efficiency" IEEE Journal of Solid-State Circuits & (Oct. 1990), vol. 25, No. 5, pp. 1217-1225.

Chow, P. et al. "The Design of an SRAM-Based Field-Programmable Gate Array-Part I: Architecture; IEEE Transaction on Very Large Integration (VLSI) Systems" (Jun. 1999), vol. 7, No. 2, pp. 191-197.

Chow, P. et al.; "The Design of an SRAM-Based Field-Programmable Gate Array-Part II: Circuit Design and Layout; IEEE Transaction on Very Large Scale Integration (VLSI) Systems" (Sep. 1999), vol. 7, No. 3, pp. 321-330.

Demjanenko, M. et al., "Dynamic Techniques for Yield Enhancement of Field Programmable Logic Arrays" New Frontiers in Testing. Washington, Sep. 12-14, 1988, Proceedings of the International Test Conference, Washington, IEEE Comp. Soc Press, US, vol. Conf. 19, Sep. 12, 1988, pages abstract p. 485, col. 1, line 15-p. 487, col. 1, line 13.

Wey C-L et al., "Design of Repairable and Fully Testable Folded PLAs", Proceedings of the International Conference on Computer Design: VLSI in Computers and Processors, Cambridge, MA, Sep. 17-19, 1990, Los Alamitos, IEEE Comp. Soc. Press, US, Sep. 17, 1990, pp. 112-115, XP010020931 ISBN: 0-8186-2079-X abstract p. 112, col. 1, line 15-p. 113, col. 1, line 14.

Demjanenko et al., "Dynamic Techniqués for Yield Enhancement of Field Programmable Logic Arrays", New Frontiers in Testing, Washington, Sep. 12-14, 1988, Proceedings of the International Test Conference, Washington IEEE Comp. Soc. Press, US, vol. Conf. 19, Sep. 12, 1988, pp. 485-491, XP000044777, abstract p. 485, col. 1, line 15—p. 487, col. 1, line 13.

Wey, C-L et al, "Design of repairable and fully testable folded PLAs", Proceedings of the International Conference on Computer Design: VLSI in Computers and Processors Cambridge, MA., Sep. 17-19, 1990, Los Alamitos, IEE Comp. Soc. Press, US, Sep. 17, 1990, pp. 112-115, XP010020931, ISBN: 0-8186-2079-X abstract p. 112, col. 1, line 15—p. 113, col. 1, line 14.

* cited by examiner

RECONFIGURABLE CIRCUIT WITH REDUNDANT RECONFIGURABLE CLUSTER(S)

TECHNICAL FIELD

The present invention relates to the field of reconfigurable circuits; in particular, to a reconfigurable circuit with redundant reconfigurable cluster(s), and its applications.

BACKGROUND

Reconfigurable circuits are circuit devices that may be reconfigured through programming to realize a variety of different functions, so long as the complexities of the desired functions are not too high. An example of the reconfigurable circuits is the Field Programmable Gate Array (FPGA) circuit. Typically, 20 to 50 transistors of a reconfigurable circuit are required to implement each transistor of a target function. As a result, reconfigurable circuits tend to be the largest circuits for each generation of integrated circuit technology. In turn, because of the inherent large size, manufacturing yield and pre-mature partial operational failure have been persistent problems for the reconfigurable circuit manufacturers and users.

Nonetheless, reconfigurable circuits are popular because they introduce low Non Recurring Expenses (NRE) when compared to Application Specific Integrated Circuit (ASIC). Further, reconfigurable circuits enable ASIC, up to a certain degree of complexity, to be emulated to ensure correctness, before the ASIC are rendered into actual silicon. A process that significantly reduces the cost of ASIC development.

Currently, one technique for addressing the various yield problems is to bypass defective elements through laser trimming during the fabrication process. After the circuits are tested, a laser is used to cut some connections in such a way that defective elements are bypassed. Pre-mature partial failures are mainly addressed through a burn-in process, which is a technique for artificially aging the component to eliminate those that experience early failures. Both of these techniques incur a significant cost during the fabrication process and give no guarantee regarding the possibility of failures at any time during the lifetime of the component.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION

In the following detailed description, reference is made to the accompanying drawings which form a part hereof wherein like numerals designate like parts throughout, and in which are shown, by way of illustration, specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment, but it may.

Figure 1:
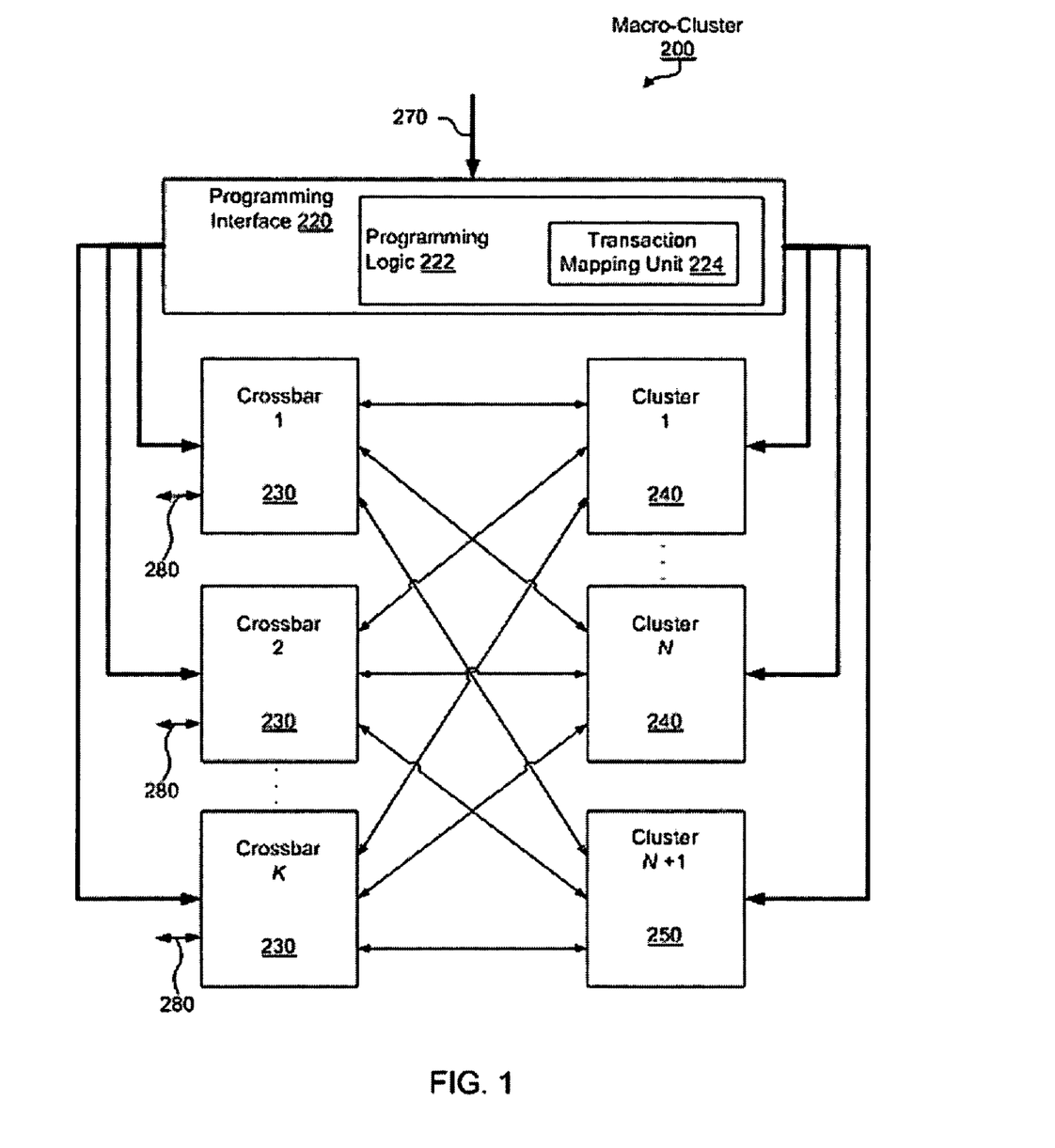
FIG. 1 illustrates a block diagram of a portion of a reconfigurable circuit, employing one or more redundant clusters, in accordance with various embodiments of the present invention.

Referring now to FIG. 1, wherein a block diagram of a portion of a reconfigurable circuit having one or more redundant reconfigurable clusters, in accordance with embodiments of the invention, is shown. For the embodiments, the portion illustrated is referred to as a macro reconfigurable cluster 200 of the reconfigurable circuit (hereinafter, simply macro-cluster). The reconfigurable circuit may have one or more of the illustrated macro-cluster 200, coupled to each other, with each macro-cluster 200 having a number of reconfigurable clusters 240 and 250 (hereinafter, simply clusters). Each cluster may have a number of resources. Examples of such resources include but are not limited to reconfigurable logic, memory, multiplier, and so forth. However, in alternate embodiments, the present invention may be practiced with or without the various clusters being organized into macro-clusters.

Additionally, for the embodiments, macro-cluster 200 includes a number of reconfigurable interconnect devices 230 and programming interface 220, coupled to each other and clusters 240 and 250 as shown. An example of a reconfigurable interconnect device is a crossbar. As will be described in more detail below, programming interface 220 is endowed with appropriate logic suitable for the constitutions of clusters 240 and 250 of the particular embodiments, to enable a subset of clusters 240 and 250, e.g. clusters 240, to be externalized for application usage, and the remaining cluster or clusters, e.g. cluster 250, to operate as a redundant cluster or clusters, transparently replacing a defective one or defective ones of the externalized clusters. As will be described in more detail below, the externalized clusters may be logical, as opposed to physical. The externalized clusters, whether logical or physical, may be referred to as primary clusters.

For the purpose of this invention, the term "transparency" and its related variants refer to the fact that at a minimum, the corresponding substitution of one of the one or more redundant clusters, e.g. cluster 250, for a defective one of the remaining clusters, e.g. cluster 240, is inconsequential to the configuration data stream for configuring the replacing cluster as well as the remaining clusters 240 to perform a set of targeted function(s). In other words, the configuration data stream does not have to be modified, even though one of the targeted clusters may be defective.

For the purpose of this invention, a defect in a reconfigurable interconnect device 230 that translates into the incapacity/inability to connect with a reconfigurable cluster 240 or 250 may be considered to be a defect of said reconfigurable cluster 240 or 250.

Continuing to refer to FIG. 1, in various embodiments, macro-cluster 200 has n+1 clusters 240 and 250 that are homogenous, i.e., clusters 240 and 250 are identical clusters (hereinafter, homogeneous embodiments). In various ones of these homogeneous embodiments, programming interface 220 is adapted with appropriate logic, to be described more fully below, such that, n of the n+1 clusters 240 may be externalized for application usage, with the single remaining cluster 250 operating as a redundant cluster. That is, for these homogeneous embodiments, redundant cluster 250 may be employed to transparently replace any defective one of the n externalized clusters 240.

Before proceeding with further description, it should be noted that while for ease of understanding, the homogenous embodiments are described with the subset of the "top" n clusters 240 illustrated in FIG. 1 as being externalized for application usage, and the "lowest" cluster 250 as the redundant cluster, the arrangement is transparent to the application, and known only to programming interface 220. Moreover, in various alternate embodiments, the invention may be practiced with programming interface 220 operating with any n clusters of clusters 240 and 250 as externalized for application usage, and the remaining one as the redundant cluster.

In various ones of the homogeneous embodiments, programming interface 220 is adapted with appropriate logic, also to be described more fully below, such that, m of the n+1 clusters 240 and 250, m and n being both greater than 1, but m being less than n, are externalized for application usage, and the remaining n+1−m clusters 240 and 250 are operated as the redundant clusters. That is, for these homogeneous embodiments, any one of the n+1−m redundant clusters may be employed to replace any defective one of the m externalized clusters, up to n+1−m externalized clusters.

In still other homogeneous embodiments, with programming interface 220 endowed with the appropriate logic, the m externalized clusters may be logical, that are mapped to any m of the n+1 physical reconfigurable clusters. Thus, for these homogeneous embodiments, any one of the n+1 clusters, up to n+1−m clusters, may be employed to replace up to n+1−m defective clusters.

Still referring to FIG. 1, in various embodiments, the n+1 clusters 240 and 250 are heterogeneous, that is, at least two of clusters 240 and 250 are dissimilar from each others (hereinafter, heterogeneous embodiments). For these heterogeneous embodiments, in addition to programming interface 220 being endowed with the appropriate logic, at least one of the clusters 240 and 250 is endowed with the union of the resource of one each of the different clusters, e.g. cluster 250 (hereinafter, "super" cluster). The other dissimilar clusters, e.g. clusters 240, are externalized for application usage. Accordingly, "super" cluster 250 may be employed to replace a defective one of the various externalized dissimilar clusters.

In various ones of these heterogeneous embodiments, externalized dissimilar clusters 240 include at least one reconfigurable cluster with a multiplier, and one reconfigurable cluster with memory. For these heterogeneous embodiments, "super" redundant reconfigurable cluster 250 includes both the multiplier and the memory.

In various ones of these heterogeneous embodiments, the various resource of a "super" reconfigurable cluster 250 are adapted to be in a default off state, and complementary resources are additionally provided to enable the resource to be selectively enabled (e.g. by programming interface 220). As a result, for these various heterogeneous embodiments, the programming view of the "super" reconfigurable cluster 250 is the same as the reconfigurable cluster 240 being replaced, whichever it is. However, in alternate embodiments, as will be described in more detail below, the "super" reconfigurable cluster 250 and the other heterogeneous reconfigurable clusters 240 may be allowed to have different programming views.

Continuing to refer to FIG. 1, in various embodiments, in addition to n+1 clusters 240 and 250, macro-cluster 200 has k reconfigurable interconnect devices 230, where k is an integer. For these embodiments, each cluster 240 or 250, homogeneous or heterogeneous, in addition to its reconfigurable resources (i.e. reconfigurable logic, memory, etc.), further includes a programming port coupled to programming interface 220, $\alpha*k$ input ports and $\beta*k$ output ports coupled to the k reconfigurable interconnect devices 230, where $\alpha$ and $\beta$ are also integers. Further, $\alpha$ of the input ports and $\beta$ of the output ports of a cluster 240 are coupled to each of the k reconfigurable interconnect devices 230. The reconfigurable resource is coupled to the programming port, the $\alpha*k$ input ports and the $\beta*k$ output ports. The reconfigurable resource of a cluster may be configured through the cluster's programming port to receive inputs from any of the cluster's $\alpha*k$ input ports and output onto any of the cluster's $\beta*k$ output ports.

In various ones of these embodiments, each interconnect device 230 includes a programming port coupled to programming interface 220, $\alpha*(n+1)$ output ports, $\beta.*(n+1)$ input ports, and reconfigurable interconnect elements. Further, $\alpha$ of the output ports and $\beta$ of the input ports of an interconnect device 230 are coupled to each of the clusters 240 and 250. The reconfigurable interconnect elements are coupled to the programming port; the $\alpha*(n+1)$ output ports, and the $\beta.*(n+1)$ input ports. The reconfigurable interconnect elements may be configured through the interconnect device's programming port to receive inputs from any of the interconnect device's $\alpha*k$ input ports and output onto any of the interconnect device's $\beta*k$ output ports.

Still referring to FIG. 1, programming interface 220 includes programming port(s) 270 and programming logic 222. Programming port(s) 270 is (are) provided to facilitate receipt of configuration data from an external source to program reconfigurable clusters 240 and 250, and reconfigurable interconnect devices 230 to realize one or more targeted functions. Programming logic 222 is adapted to configure reconfigurable clusters 240 and 250, and interconnect devices 230 in accordance with the received configuration data. For the embodiments, programming logic 222 further includes configuration transaction mapping logic 224 adapted to remap configuration transactions targeted for at least a defective one of the primary reconfigurable clusters to target a replacement redundant cluster and to remap configuration transactions targeted for interconnect devices 230 so that connections to and from at least a defective one of the primary reconfigurable clusters are rerouted to a replacement redundant cluster.

In various embodiments, the transaction mapping logic 224 may be provided with the mapping information from an external resource, e.g. also through programming port 270. For these embodiments, the detection and identification of defective ones of the primary clusters may be performed by the external source also. Macro-cluster 200 may include additional testing access circuitry (not shown), e.g. scan cells, to enable testing circuitry external to macro-cluster 200 to perform the defect detection and identification. In various embodiments, macro-cluster 200 may include test circuitry dedicated to performing the defect detection and identification for the macro-cluster. In still other embodiments, each of clusters 240 and 250 may be provided with test circuitry dedicated to performing the defect detection and identification for the particular cluster.

In various embodiments, where dedicated test circuitry are provided to each macro-cluster 200, or each of clusters 240 and 250 to perform defect detection and identification, programming logic 222 may be further adapted to initiate on its own defect detection and identification testing, and configure transaction mapping logic 224 to operate accordingly, as long as the number of defective primary cluster or clusters is smaller than or equal to the number of redundant cluster or clusters available. In various embodiments, programming logic 222 is adapted to disable macro-cluster 200 and report its disabled condition, if it detected more defective primary clusters than available redundant clusters.

Figure 2:
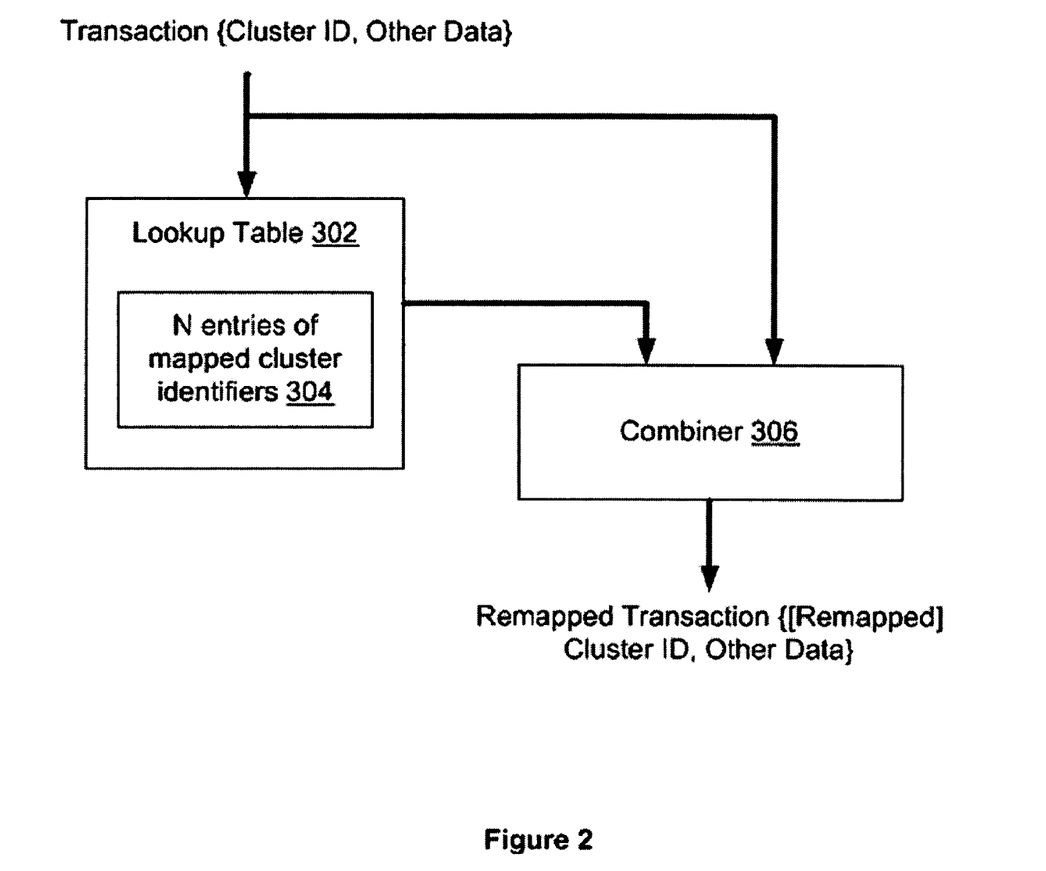
FIG. 2 illustrates a portion of the programming interface of FIG. 1 in further detail, in accordance with various embodiments.

Referring now to FIG. 2, wherein transaction mapping unit 224, in accordance with various embodiments, is illustrated in further detail. For the embodiments, transaction mapping unit 222 may include a lookup table 302 and combiner 306 coupled to each other as shown. Lookup table 302 includes n storage locations for storing mapping information 304 for n clusters. In various embodiments, mapping information 304 comprises n entries of remapped cluster identifications. For the physical embodiments, mapping information 304 maps each of n cluster identifiers of the n clusters to itself or the cluster identifier of the redundant cluster. For example, if cluster n+1 is the redundant cluster, and cluster $n_0$ is determined to be defective, the cluster identifier n+1 is stored in the storage location for storing mapping information 304 for cluster $n_0$ to map any transactions targeted for cluster $n_0$ to be retargeted for cluster n+1. For the logical embodiments, mapping information 304 maps each of the n logical cluster identifiers to a physical cluster, which may be a primary cluster or a redundant cluster.

In various embodiments, combiner 306 is employed to reconstitute the transactions, with the original identification for the targeted cluster of each transaction being replaced by an identifier of a redundant cluster read out of lookup table 302, if the targeted cluster is defective.

In various embodiments, programming logic 222 including transaction mapping logic 224 may be implemented in hardware or software, or a combination thereof, in whole or in part. For the embodiments, where at least a portion of programming logic 222 (e.g. all or portions of transaction mapping logic 224) is implemented in software, programming interface 220 may be provided with an appropriate non-volatile storage to store the implementing instructions, and a processor coupled to the non-volatile storage to execute the implementing instructions.

Note that the phrase "transactions targeted for a cluster" includes not only configuration transactions targeted for reconfigurable resources of a primary cluster, but also configuration transactions targeting to couple the various input and output ports of the interconnect devices 230 to the particular cluster. As illustrated, combiner 306 is employed to reconstitute the original transactions, based on the outputs of lookup table 302, and the corresponding other transaction data of the original transactions.

Figure 3:
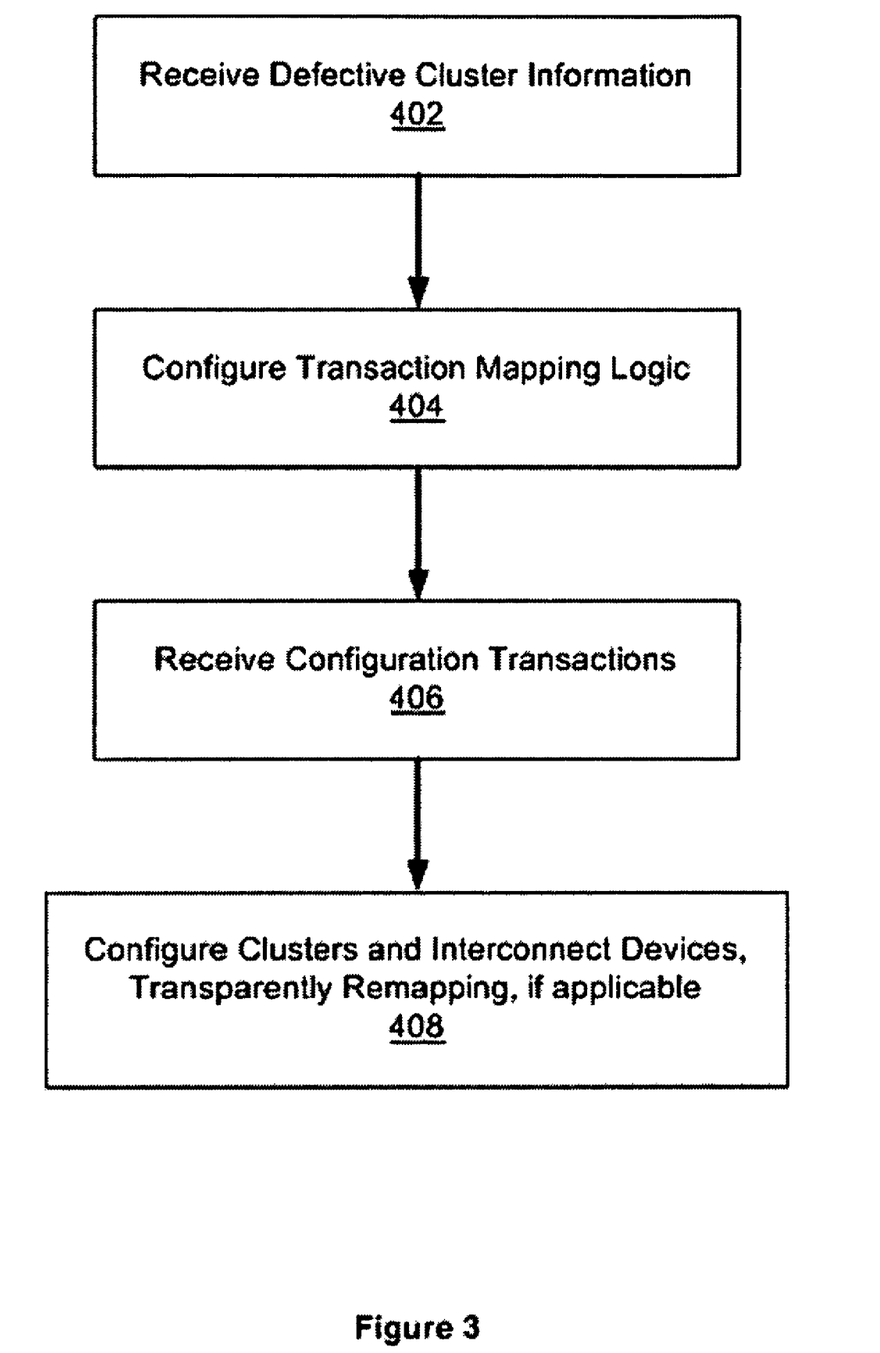
FIG. 3 illustrates a flowchart view of a method of operation, according to various embodiments.

Referring now to FIG. 3, wherein a flow chart view of an operational method of the invention, in accordance with various embodiments, is illustrated. As shown, method 400 starts with receipt 402 of cluster defective information, if any, by programming interface 220. As described earlier, the defective cluster information, if any, may be provided to programming interface 220 by an external source, or determined by programming interface 220 itself, depending on the embodiments.

Next, assuming the number of defective cluster or clusters is smaller than or equal to the number of redundant cluster or clusters available, programming interface 220 configures 404 its transaction mapping logic 224 accordingly, based at least in part on the defective cluster information received, if any. As described earlier, for various embodiments, if the number of defective clusters exceeds the number of redundant cluster or clusters available, programming interface 220 disables the macro-cluster and reports its disabled state.

Thereafter, programming interface 220 may be provided 406 with configuration information to configure clusters 240 and 250 and interconnect devices 230. In response, programming interface 220 programs 408 selected ones of clusters 240 and 250 and interconnect devices 230, accordingly, remapping the configuration transactions transparently, if applicable. Thus, as described earlier, under the present invention, configuration information may be advantageously provided in a transparent manner, without having to take into account whether any of the primary clusters are defective, and without the configuration of the clusters and the interconnect devices to realize certain target functions having to take these defective clusters into consideration.

As described earlier, for heterogeneous embodiments involving at least one "super" cluster, programming interface 220 may further configure the on or off state of the various resources in a "super" cluster, to configure the "super" cluster to functionally match the defective cluster being replaced.

Note that while the present invention is designed to enable defective elements of a reconfigurable circuit to be addressed transparently, the transparency can be achieved as long as the number of defective cluster or clusters is smaller than or equal to the number of redundant cluster or clusters available.

Figure 4:
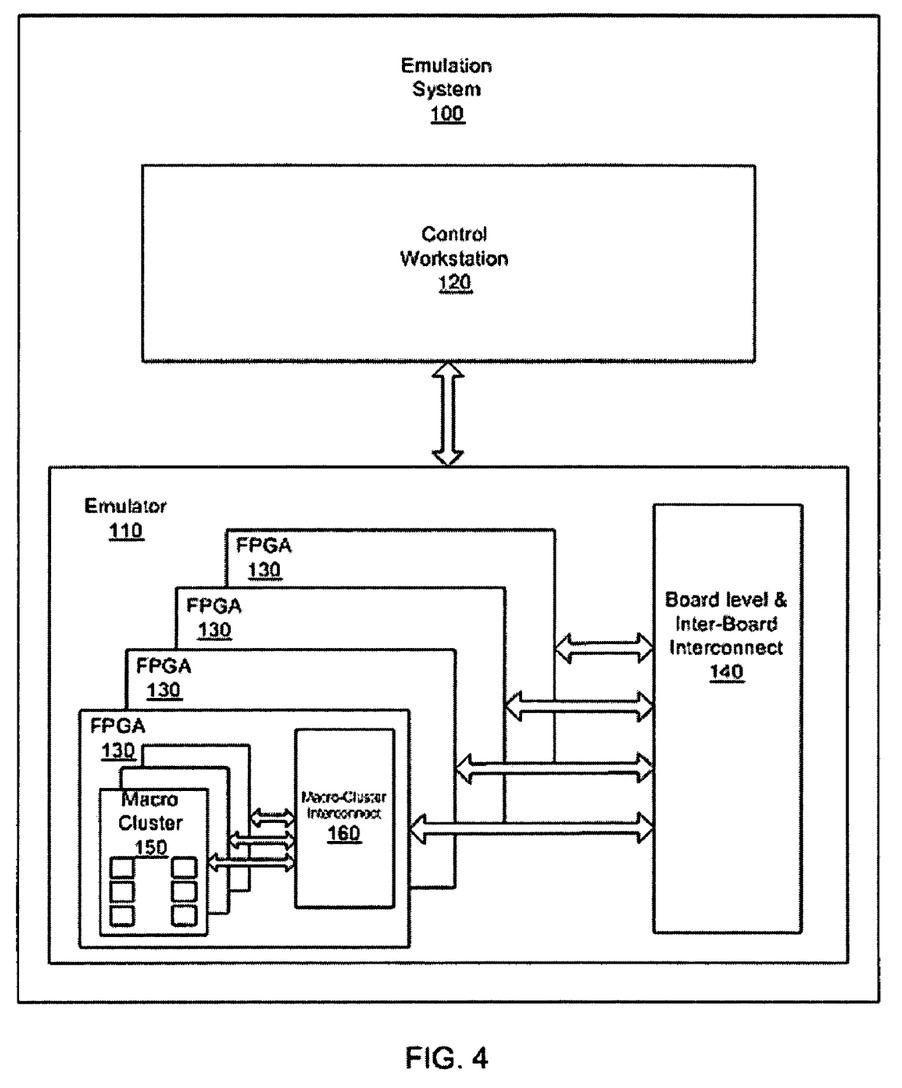
FIG. 4 illustrates a block diagram of an exemplary emulation system that includes reconfigurable circuits with redundant clusters, in accordance with various embodiments.

Referring now to FIG. 4, a block diagram of an exemplary emulation system 100 including reconfigurable circuits with redundant reconfigurable clusters, is illustrated. Exemplary emulation system 100 illustrates an example application of the earlier described reconfigurable circuits with various embodiments of macro-cluster 200.

As illustrated, emulation system 100 includes an emulator 110 and a control workstation 120. The emulator 110 includes a number of reconfigurable circuit devices 130 interconnected by board and/or board level interconnects 140. At least one of the reconfigurable circuit devices 130 has a number of interconnected macro-clusters 150. Further, at least one of the macro-clusters 150 is implemented using one of the earlier described embodiments of macro-cluster 200.

In various embodiments, the reconfigurable circuit devices 130 are organized into groups, and the groups are correspondingly disposed on a number of circuit boards (not shown). For these embodiments, board and/or board level interconnects 140 include board level interconnects reconfigurably and selectively interconnecting selected ones of the reconfigurable circuit devices 130 on the corresponding circuit boards. The inter-board interconnects in turn reconfigurably and selectively interconnect the board-level interconnects of the circuit boards to one another.

Except for reconfigurable circuit device 130 incorporated with one or more embodiments of macro-cluster 200, other elements of emulation system 100 are intended to represent a broad category of these elements found in conventional emulation systems, and thus will not be otherwise further described.

Accordingly, emulation system 100 may be employed to more advantageously emulate one or more ASIC designs, to verify their correct operations, prior to rendering the ASIC designs into silicon, potentially further reducing the cost of the ASIC development.

In alternate embodiments, reconfigurable circuits having redundant clusters as described with reference to FIGS. 1-3, may be used in a variety of other systems, including but not limited to Compact Disc and/or Digital Versatile Disk players, set-top boxes, televisions, projection devices, and so forth.

Although specific embodiments have been illustrated and described herein, it will be appreciated by those of ordinary skill in the art and others, that a wide variety of alternate and/or equivalent implementations may be substituted for the specific embodiments shown in the described drawings without departing from the scope of the present invention. This application is intended to cover any adaptations or variations of the embodiment discussed herein. Therefore, it is manifested and intended that the invention be limited only by the claims and the equivalence thereof.

What is claimed is:

1. A reconfigurable circuit comprising:
    a programming interface;
    a plurality of reconfigurable interconnect devices, each reconfigurable interconnect device being coupled to the programming interface and including:
        a programming port;
        a plurality of input ports and a plurality of output ports; and
        reconfigurable connectivity coupled to the programming port and the input and output ports, and configurable to selectively couple the input ports to the outputs ports in accordance with programming received via the programming port; and
    a plurality of clusters of reconfigurable logic, each cluster being coupled to the programming interface and to the plurality of reconfigurable interconnect devices, including at least a redundant one of the clusters configurable to operate in place of a defective one of the clusters.

2. The reconfigurable circuit as recited in claim 1, wherein the programming interface is configurable to perform a logical to physical mapping to enable a redundant one of the clusters to operate in place of the defective one of the clusters.

3. The reconfigurable circuit as recited in claim 1, wherein each cluster includes:
    a programming port;
    $\alpha*k$ input ports, $\alpha$ of said input ports being coupled to each of k reconfigurable interconnect devices where k and $\alpha$ are integers;
    $\beta*k$ output ports, $\beta$ of said output ports being coupled to each of k reconfigurable interconnect devices where k and $\beta$ are integers; and
    a reconfigurable module coupled to the programming port and the input and output ports, and configurable to implement at least one of a plurality of functions in accordance with programming received via the programming port.

4. The reconfigurable circuit as recited in claim 1, wherein the programming interface includes logic to:
    determine whether external data is directed at a cluster or a reconfigurable interconnect device; and
    if external data includes a logical destination address for a defective cluster, whether to program the defective cluster or to program interconnect devices to couple the defective cluster, the programming interface substitutes a destination address for the replacing redundant cluster in lieu of the defective cluster address and passes the remaining data transparently.

5. The reconfigurable circuit of claim 1, wherein each of the clusters are identical.

6. The reconfigurable circuit of claim 1, wherein each of the plurality of clusters are coupled to at least one of the input ports and at least one of the output ports of each of the reconfigurable interconnect devices.

7. A reconfigurable circuit comprising:
    a programming interface;
    a plurality of reconfigurable interconnect devices, each reconfigurable interconnect device being coupled to the programming interface; and
    a plurality of clusters of reconfigurable logic, each cluster being coupled to the programming interface and to the plurality of reconfigurable interconnect devices, including at least a redundant one of the clusters configurable to operate in place of a defective one of the clusters;
    wherein the programming interface, the reconfigurable interconnect devices, and the reconfigurable logic form a macro-cluster.

8. The reconfigurable circuit as recited in claim 7, wherein each reconfigurable interconnect device includes:
    a programming port;
    $\alpha*(n+1)$ output ports, $\alpha$ of said output ports being coupled to each of n+1 clusters where n and $\alpha$ are integers;
    $\beta*(n+1)$ input ports, $\beta$ of said input ports being coupled to each of n+1 cluster where n and $\beta$ are integers; and
    reconfigurable connectivity coupled to the programming port and the input and output ports, and configurable to selectively couple the input ports to the output ports in accordance with programming received via the programming port.

9. The reconfigurable circuit of claim 7, wherein the reconfigurable circuit comprises at least one other macro-cluster, the macro-clusters being coupled to one another.

10. A method comprising:
    receiving data identifying a defective cluster of reconfigurable logic in a reconfigurable circuit having a plurality of clusters of reconfigurable logic, including the defective cluster and at least one redundant cluster;
    programming at least one of a plurality of reconfigurable interconnect devices to receive inputs targeted of the identified defective cluster on at least one of the interconnect device's plurality of input ports and to output to a redundant cluster on at least one of the interconnect device's plurality of outputs ports; and
    programming the redundant cluster to operate in place of the identified defective cluster.

11. The method as recited in claim 10, wherein the programming of the redundant cluster comprises transparently configuring the redundant cluster to provide equivalent functionality the defective cluster was to implement, employing same programming for programming the defective cluster and further comprises transparently operating the reconfigurable circuit, including automatically re-routing data destined for the defective cluster to the replacing redundant cluster.

12. The method as recited in claim 11, wherein the automatic re-routing comprises substituting, in a cluster transaction, an identifier for the redundant cluster for a received logical identifier of the defective cluster.

13. The method as recited in claim 11, wherein the programming of the redundant cluster comprises transparently configuring the redundant cluster to provide a memory function and/or a second function, the defective cluster was to implement.

14. The method as recited in claim 11, wherein the programming of the redundant cluster comprises transparently configuring the redundant cluster to provide a multiply function and/or a second function, the defective cluster was to implement.

15. The method as recited in claim 11, wherein the programming of the redundant cluster comprises transparently configuring the redundant cluster to provide a multiply function and a memory function or any one of the multiply or memory function or none, the defective cluster was to implement.

16. The method as recited in claim 10, wherein the reconfigurable interconnect devices and the defective and redundant clusters are members of a macro-cluster of the reconfigurable circuit, which has a plurality of macro-clusters coupled to each other, and the method further includes repeating the identifying, programming of the at least one interconnect device, and the programming of the redundant cluster for at least one other macro-cluster.

17. A device comprising:
a programming interface to receive external application data associated with programming any one of a plurality of functions;
a plurality of reconfigurable interconnects, each reconfigurable interconnect being coupled to the programming interface and including:
a programming port;
a plurality of input ports and a plurality of output ports; and
reconfigurable connectivity coupled to the programming port and the input and output ports, and configurable to selectively couple the input ports to the outputs ports in accordance with programming received via the programming port;
a plurality of clusters coupled to the plurality of reconfigurable interconnects and the programming interface, each of the plurality of clusters being logically visible to external application data; and
at least one redundant cluster configurably identical to at least one cluster of the plurality of clusters, but not visible to the external application data.

18. The device as recited in claim 17, wherein the programming interface is configured to program the at least one redundant cluster to substitute for at least one defective cluster in the plurality of clusters and to program the plurality of reconfigurable interconnects to redirect application data from the at least one defective cluster to the at least one redundant cluster.

19. The device as recited in claim 17, wherein each of the clusters are identical.

20. A device comprising:
a programming interface to receive external application data associated with programming any one of a plurality of functions;
a plurality of reconfigurable interconnect, each reconfigurable interconnect being coupled to the programming interface;
a plurality of clusters coupled to the plurality of reconfigurable interconnect and the programming interface, each of the plurality of clusters being logically visible to external application data; and
at least one redundant clusters configurable identical to at least one cluster of the plurality of clusters, but not visible to the external application data;
wherein the programming interface, the plurality of reconfigurable interconnects, the plurality of clusters, and the at least one redundant cluster form a macro-cluster and wherein the device further comprises at least one other macro-cluster, the macro-clusters being coupled to one another.

21. The device as recited in claim 17, wherein the at least one redundant cluster is coupled to each of the plurality of reconfigurable interconnects and the programming interface.

22. A system comprising:
a plurality of circuit boards, each circuit board having a plurality of reconfigurable circuits and board level reconfigurable interconnects to reconfigurably and selectively interconnect the reconfigurable circuits of the circuit board to one another, wherein at least one of the reconfigurable circuits includes a plurality of reconfigurable interconnect devices, each reconfigurable interconnect device including:
a programming port;
a plurality of input ports and a plurality of output ports; and
reconfigurable connectivity coupled to the programming port and the input and output ports and configurable to selectively couple the input ports to the outputs ports in accordance with programming received via the programming port;
a plurality of clusters of reconfigurable logic and at least one redundant cluster of reconfigurable logic configurable to operate in place of a defective one of the clusters; and
inter-board reconfigurable interconnects to reconfigurably and selectively interconnect the board level interconnects of the circuit boards to one another.

23. The system of claim 22, wherein the at least one of the reconfigurable circuits further comprises a programming interface to receive external application data associated with programming any one of a plurality of functions, each of the reconfigurable interconnects and the clusters being coupled to the programming interface of the at least one reconfigurable circuit.

24. The system of claim 22, wherein each of the plurality of clusters are logically visible to external application data, and wherein at least one redundant cluster is configurably identical to at least one cluster of the plurality of clusters of the reconfigurable circuit but not visible to the external application data.

* * * * *

UNITED STATES PATENT AND TRADEMARK OFFICE
CERTIFICATE OF CORRECTION

PATENT NO.          : 7,478,261 B2
APPLICATION NO.  : 11/225750
DATED                  : January 13, 2009
INVENTOR(S)         : Frederic Reblewski

Page 1 of 1

It is certified that error appears in the above-identified patent and that said Letters Patent is hereby corrected as shown below:

Column 10, line 1 claim 20, "redundant clusters configurable" should read --redundant cluster configurably--.

Signed and Sealed this

Twenty-ninth Day of September, 2009

David J. Kappos
*Director of the United States Patent and Trademark Office*